(12) United States Patent
Abe

(10) Patent No.: US 7,796,447 B2
(45) Date of Patent: Sep. 14, 2010

(54) SEMICONDUCTOR MEMORY DEVICE HAVING OUTPUT IMPEDANCE ADJUSTMENT CIRCUIT AND TEST METHOD OF OUTPUT IMPEDANCE

(75) Inventor: Tsuneo Abe, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 194 days.

(21) Appl. No.: 12/107,945

(22) Filed: Apr. 23, 2008

(65) Prior Publication Data

US 2008/0259697 A1   Oct. 23, 2008

(30) Foreign Application Priority Data

Apr. 23, 2007   (JP) .............................. 2007-113575

(51) Int. Cl.
  *G11C 7/06* (2006.01)
(52) U.S. Cl. ................................. 365/189.07; 365/201
(58) Field of Classification Search ............ 365/189.07, 365/201; 327/108, 112; 326/30, 82, 86
See application file for complete search history.

(56) References Cited

U.S. PATENT DOCUMENTS 7,038,486 B2 * 5/2006 Aoyama et al. ............... 326/30

2006/0158198 A1   7/2006 Fujisawa
2007/0296470 A1 * 12/2007 Hayashi et al. ............. 327/108

FOREIGN PATENT DOCUMENTS

JP   2002-232286   8/2002
JP   2006-203405   4/2008

* cited by examiner

*Primary Examiner*—Vu A Le
(74) *Attorney, Agent, or Firm*—Young & Thompson

(57) ABSTRACT

A semiconductor device has an output impedance adjustment circuit for automatically adjusting an output impedance of an output circuit including transistors connected in parallel. The output impedance adjustment circuit includes: a replica circuit including a circuit portion of the substantially same configuration as the output circuit; a comparator for comparing a magnitude of the output impedance of the replica circuit with a reference resistor and for outputting a comparison result as an internal counter control signal; a switching controller selectively switching between an external counter control signal from outside and the internal counter control signal; and a counter circuit for performing a count operation selectively according to the internal or the external counter control signal and for outputting a count value as an adjustment code which is supplied to the output circuit and the replica circuit so that each transistor is controlled to be on/off based on the adjustment code.

11 Claims, 11 Drawing Sheets

OUTPUT IMPEDANCE ADJUSTMENT CIRCUIT (MODIFICATION)

SEMICONDUCTOR MEMORY DEVICE HAVING OUTPUT IMPEDANCE ADJUSTMENT CIRCUIT AND TEST METHOD OF OUTPUT IMPEDANCE

BACKGROUND OF THE INVENTION

1. Field of the Invention

The present invention relates to an output impedance adjustment circuit for adjusting an output impedance of an output circuit even when process, temperature or supply voltage fluctuates in a semiconductor device, and particularly relates to a semiconductor device configured so that an operation test for the output circuit can be performed according to a predetermined test condition in a test of the semiconductor device.

2. Description of the Related Art

In recent years, there has been a demand for high-speed data transfer in semiconductor devices. Hence, a problem has arisen that signal reflection occurs at, for example, a connection point between a semiconductor device and a bus, thereby degrading signal quality. Accordingly, there is a requirement for a function to suppress the signal reflection by maintaining an output impedance value of an output circuit of the semiconductor device at a constant reference resistance. Conventionally, there has been used an output impedance adjustment circuit for automatically adjusting the output impedance of the output circuit of the semiconductor device to a predetermined standard value (see, for example, Japanese Patent Laid-Open No. 2002-232286 and Japanese Patent Laid-Open No. 2006-203405). As shown in FIG. 10, the conventional output impedance adjustment circuit includes a replica circuit unit 101, a comparator unit 102, a counter control unit 103 and a selector unit 104, and there is provided an output circuit unit 105 whose output impedance is controlled.

In FIG. 10, the replica circuit unit 101 includes a circuit portion having the same configuration as the output circuit unit 105 and generates a control voltage which varies depending on the output impedance of the circuit portion. The comparator unit 102 compares the control voltage output from the replica circuit unit 101 with a reference voltage, and outputs a binary internal counter control signal SS which varies according to a magnitude relation between these voltages. The counter control unit 103 controls operation of a counter 110, which is an up/down counter having a predetermined number of bits, on the basis of the internal counter control signal SS from the comparator unit 102. Thus, the count value of the counter 110 is output as an adjustment code C. The selector unit 104 performs selective switching control between the adjustment code C from the counter 110 and a test code T from outside, and outputs the selected code to the output circuit unit 105 and the replica circuit unit 101. The output circuit unit 105 is composed of a plurality of parallel-connected MOS transistors, and is controlled to be on/off according to the adjustment code C or the test code T, thereby causing the output impedance of the output circuit unit 105 to change. The output node ND of the output circuit unit 105 is connected to a subsequent circuit.

By employing the above-described output impedance adjustment circuit, the adjustment code C is automatically adjusted to an appropriate value by the comparator unit 102 and the counter control unit 103 through feedback to the replica circuit unit 101, even in a case where the output impedance of the output circuit unit 105 varies due to temperature or supply voltage variations. Consequently, by periodically performing the automatic adjustment during normal operation using the output impedance adjustment circuit, it is possible to control the output circuit unit 105 so that the output impedance thereof is maintained at the standard value.

In a test of the semiconductor device, an operation test needs to be performed by intentionally deviating the output impedance of the output circuit unit 105 from the standard value. When performing such an operation test, control is performed so that an arbitrary test code T is input to the output circuit unit 105 by switching to the side of the test code T in the selector unit 104 shown in FIG. 10. In this case, a tester must set this adjustment code C to a value obtained by increasing or decreasing an arbitrary number of steps while previously taking into consideration an adjustment code C corresponding to the standard value of the output impedance of the output circuit unit 105. For example, a case is considered where the tester assumes a characteristic Ca shown in FIG. 11 regarding the relationship between the output impedance and the adjustment code C. Note that although the output impedance varies in a step-like manner, in practice, relative to the adjustment code C having a predetermined number of bits, this variation is represented by a curve in FIG. 11 for simplicity.

In the assumed characteristic Ca, the tester can set a test range having an upper limit Cx+Cy and a lower limit Cx−Cy, which are obtained by increasing or decreasing a predetermined number of steps Cy from a starting point which is an adjustment code Cx corresponding to a target value Rx of the output impedance. However, the relationship between the actual value of the output impedance and the adjustment code C varies depending on a variety of conditions (temperature, supply voltage, process variation, and the like) and therefore is difficult to determine uniformly. Accordingly, it is conceivable that in FIG. 11, the relationship changes from the assumed characteristic Ca to a characteristic Cb as the output impedance varies upward, or to a characteristic Cc as the output impedance varies downward. For these characteristics Cb and Cc, the output impedance at the adjustment code Cx of the starting point deviates from the target value Rx, and the test range is no longer appropriate. If the tester desires to correctly set the test range corresponding to the target value Rx, then the tester must follow a complex procedure, in which, after performing an automatic adjustment using the output impedance adjustment circuit, the tester measures the adjustment code C at that time and determines the test range on the basis of the obtained adjustment code C. In this manner, the conventional output impedance adjustment circuit poses a problem that, when performing tests under a variety of conditions, it is difficult to set a test range using an adjustment code precisely corresponding to the target value of the output impedance.

BRIEF SUMMARY OF THE INVENTION

An object of the present invention is to provide a semiconductor device having an output impedance adjustment circuit capable of setting an optimum test range based on an adjustment code precisely corresponding to a target value of an output impedance and performing a high-precision test with a simple procedure, even when the output impedance varies under a variety of conditions.

An aspect of the present invention is a semiconductor device having an output impedance adjustment circuit for automatically adjusting an output impedance of an output circuit including a plurality of transistors connected in parallel, wherein said output impedance adjustment circuit comprises: a replica circuit including a circuit portion of a substantially same configuration as said output circuit; a comparator for comparing a magnitude of the output impedance of said replica circuit with that of a reference resistor and for outputting a comparison result as an internal counter control signal; a switching controller capable of selectively switching between an external counter control signal supplied from outside and the internal counter control signal output from said comparator; and a counter circuit for performing a count-up or count-down operation selectively according to the internal counter control signal or the external counter control signal and for outputting a count value of a predetermined number of bits as an adjustment code, and the adjustment code is supplied to said output circuit and said replica circuit, and each of said plurality of transistors is controlled to be on/off based on the adjustment code.

According to the present invention, when automatically adjusting the output impedance in the output impedance adjustment circuit, the internal counter control signal obtained by the replica circuit and the comparator is selected, and thereby the count operation of the counter circuit is controlled by the internal counter control signal, so that the plurality of transistors is controlled to be on/off by the output adjustment code. When switching to the external counter control signal by the switching controller, the count operation of the counter circuit is controlled by the external counter control signal, and thereby the output adjustment code can be freely changed. For example, when testing the semiconductor device, the adjustment code at this point can be updated by a predetermined number of steps from a state where the output impedance has been automatically adjusted. Accordingly, even when a condition in which the output impedance varies due to fluctuation of temperature or supply voltage causes that a corresponding adjustment code cannot be precisely determined, it is possible to set an optimum test range based on the adjustment code precisely corresponding to a target value of the adjustment code, so as to perform the test of the semiconductor device.

In the present invention, said output circuit may include a first output circuit including a plurality of PMOS transistors and a second output circuit including a plurality of NMOS transistors, and said replica circuit, said comparator, said switching controller and said counter circuit may be provided separately for said first and second output circuits.

In this case, said replica circuit may include a first replica circuit corresponding to said first output circuit and a second replica circuit corresponding to said second output circuit, and said comparator may include a first comparator for comparing a voltage at a connection node of series-connected said first replica circuit and the reference resistor with a predetermined reference voltage and for outputting a first internal counter control signal, and may include a second comparator for comparing a voltage at a connection node of series-connected said first and second replica circuits with the reference voltage and for outputting a second internal counter control signal.

Further, said switching controller may selectively switch between a first external counter control signal and the first internal counter control signal, and selectively switches between a second external counter control signal and the second internal counter control signal, said counter circuit may include a first counter circuit for performing a count-up or count-down operation selectively according to the first external counter control signal or the first internal counter control signal and for outputting a count value of a predetermined number of bits as a first adjustment code, and may include a second counter circuit for performing a count-up or count-down operation selectively according to the second external counter control signal or the second internal counter control signal and for outputting a count value of a predetermined number of bits as a second adjustment code, and the first adjustment code may be output to said first output circuit and said first replica circuit so that each of said plurality of PMOS transistors is controlled to be on/off based on the first adjustment code, and the second adjustment code may be output to said second output circuit and said second replica circuit so that each of said plurality of NMOS transistors is controlled to be on/off based on the second adjustment code.

The present invention may further comprise a selector unit for selectively outputting a test code supplied from outside and the adjustment code output from said counter circuit and for supplying the code to said output circuit and said replica circuit.

In the present invention, the adjustment code may be N (N is an integer equal to or greater than two) bits, each of said output circuit and said replica circuit may include N transistors controlled to be on/off based on bits of the adjustment code, and said N transistors may have different sizes from one another. In this case, a transistor controlled based on a least significant bit of the adjustment code may have a unit size, and a transistor controlled based on an i-th ($1 \leq i \leq N-1$) bit from the least significant bit of the adjustment code may have $2^i$ times the unit size, respectively for the adjustment code of N bits represented in binary code.

In the present invention, said counter circuit may be an N-bit up/down counter for performing a count-up or count-down operation at each period of a clock and for outputting an N-bit count value as the adjustment code. In this case, a switch circuit for selectively switching a counter output of a previous stage and the clock and for connecting the selected one to a clock terminal of a subsequent stage may be provided at a predetermined position of said up/down counter. Further, an N-bit test code supplied from outside may be input to a reset terminal of each stage of said up/down counter.

Another aspect of the present invention is a test method of an output impedance for testing the output impedance of said output circuit under a predetermined condition for the above semiconductor device, comprising the steps of: automatically adjusting the output impedance of said output circuit to be tested by operating said replica circuit, said comparator, said switching controller and said counter circuit, in a state in which the internal counter control signal is supplied to said counter circuit by said switching controller; stopping a count operation of said counter circuit in a state in which the output impedance has automatically adjusted; restarting the count operation in a state in which the external counter control signal is supplied to said counter circuit by said switching controller; stopping the count operation of said counter circuit when a required time for updating the adjustment code by a predetermined steps starting from a state of being automatically adjusted with a predetermined number of steps is elapsed; and performing an operation test of the output impedance of said output circuit with the updated adjustment code.

As described above, according to the present invention, it is possible to appropriately switch between the count value of the counter circuit controlled by the internal counter control signal from the replica circuit and the comparator, and the count value of the counter circuit controlled by the external counter control signal supplied from outside, respectively as an adjustment code supplied to the output circuit. Therefore, even when the adjustment code for which the output impedance has been automatically adjusted is unknown, the internal counter control signal is switched to the external counter control signal and thereafter the adjustment code can be relatively changed, Accordingly, it is possible to set an optimum test range in a short time and to perform a high-precision test with a simple procedure, even when the output impedance characteristic varies due to an ambient condition or the like in the test of the semiconductor device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Hereinafter, an embodiment of the present invention will be described with reference to the accompanying drawings. In the embodiment described herein, a case will be described where the present invention is applied to an output impedance adjustment circuit for automatically adjusting an output impedance of an output circuit included in a semiconductor device.

Figure 1:
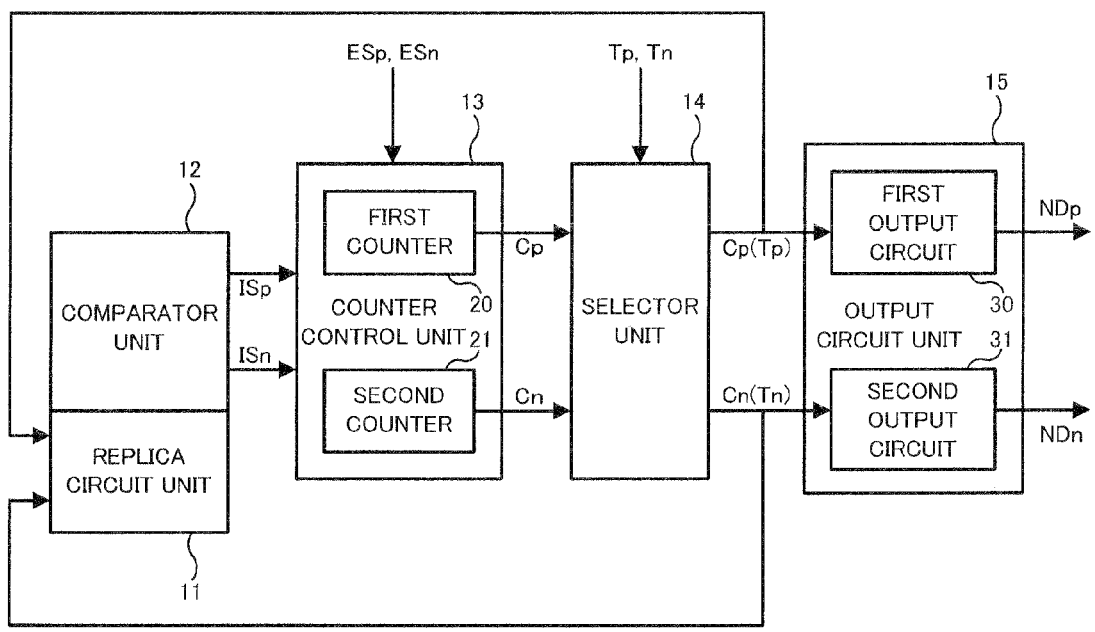
FIG. 1 is a block diagram showing an overall configuration of an output impedance adjustment circuit of an embodiment.

FIG. 1 is a block diagram showing an overall configuration of the output impedance adjustment circuit of the embodiment. The output impedance adjustment circuit shown in FIG. 1 includes a replica circuit unit 11, a comparator unit 12, a counter control unit 13, and a selector unit 14, and there is provided an output circuit unit 15 whose output impedance is controlled. The output impedance adjustment circuit shown in FIG. 1 is applied in order to adjust the output impedance of, for example, an output buffer for outputting data of a semiconductor memory such as a DRAM (Dynamic Random Access Memory).

In the configuration of FIG. 1, the replica circuit unit 11 includes a circuit portion having the same configuration as the output circuit unit 15 and generates control voltages which vary depending on output impedances of a parallel circuit of P-channel MOS transistors (hereinafter referred to as PMOS transistors) and a parallel circuit of N-channel MOS transistors (hereinafter referred to as NMOS transistors). The comparator unit 12 compares the control voltage output from the replica circuit unit 11 with a predetermined reference voltage, and outputs binary internal counter control signals ISp and ISn which vary depending on magnitude relations on the P-channel side and on the N-channel side, respectively. The signal ISp corresponds to an output impedance of the P-channel side and the internal counter control signal ISn corresponds to an output impedance of the N-channel side.

The counter control unit 13 controls operation of a first counter 20 and a second counter 21 based on the internal counter control signals ISp and ISn from the comparator unit 12 or based on external counter control signals ESp and ESn from outside. Both the first and second counters 20 and 21 are up/down counters having a predetermined number of bits and output their respective count values as adjustment codes Cp and Cn. In the counter control unit 13, it is possible to selectively switch between the internal counter control signals ISp, ISn and the external counter control signals ESp, ESn. The first and second counters 20 and 21 perform a count-up operation or a count-down operation according to the values of selected control signals.

The selector unit 14 performs selective switching control between an adjustment code Cp from the first counter 20 and a test code Tp from outside, on a path of the P-channel side. Likewise, the selector unit 14 performs selective switching control between an adjustment code Cn from the second counter 21 and a test code Tn from outside, on a path of the N-channel side. The selector unit 14 outputs these selected codes to the output circuit unit 15 and the replica circuit unit 11. In the selector unit 14, control is performed so that, for example, the adjustment codes Cp and Cn are always output during normal operation, while two types of control are performed during a test of the semiconductor device, which includes a case of outputting the adjustment codes Cp and Cn and a case of outputting the test codes Tp and Tn, according to a control method.

The output circuit unit 15 includes a first output circuit 30 whose output impedance is controlled according to the adjustment code Cp (or the test code Tp) and a second output circuit 31 whose output impedance is controlled according to the adjustment code Cn (or the test code Tn). The first output circuit 30 is connected to an output node NDp and the second output circuit 31 is connected to an output node NDn. In addition, the first and second output circuits 30 and 31 are respectively connected to subsequent circuits. Note that the number of output circuit units 15 is not limited to one, and a large number of output circuit units 15 can be provided in the entire semiconductor device.

In FIG. 1, each of the adjustment codes Cp and Cn has a predetermined number of bits appropriate for the number of adjustment steps for the output impedance. If both the adjustment codes Cp and Cn have N bits, the output impedance of the output circuit unit 15 can be controlled in a maximum of $2^N$ steps. Hereinafter, a case will be described where both the adjustment codes Cp and Cn have 4 bits and the output impedance of the output circuit unit 15 is controlled in 16 steps, for simplicity. Note that the test codes Tp and Tn are also assumed to have 4 bits. In the following, it is assumed that the above adjustment code Cp is composed of 4 bits of adjustment codes Cp0, Cp1, Cp2 and Cp3, the above adjustment code Cn is composed of 4 bits of adjustment codes Cn0, Cn1, Cn2 and Cn3, the above test code Tp is composed of 4 bits of test codes Tp0, Tp1, Tp2 and Tp3, and the above test code Tn is composed of 4 bits of test codes Tn0, Tn1, Tn2 and Tn3.

Figure 2A:
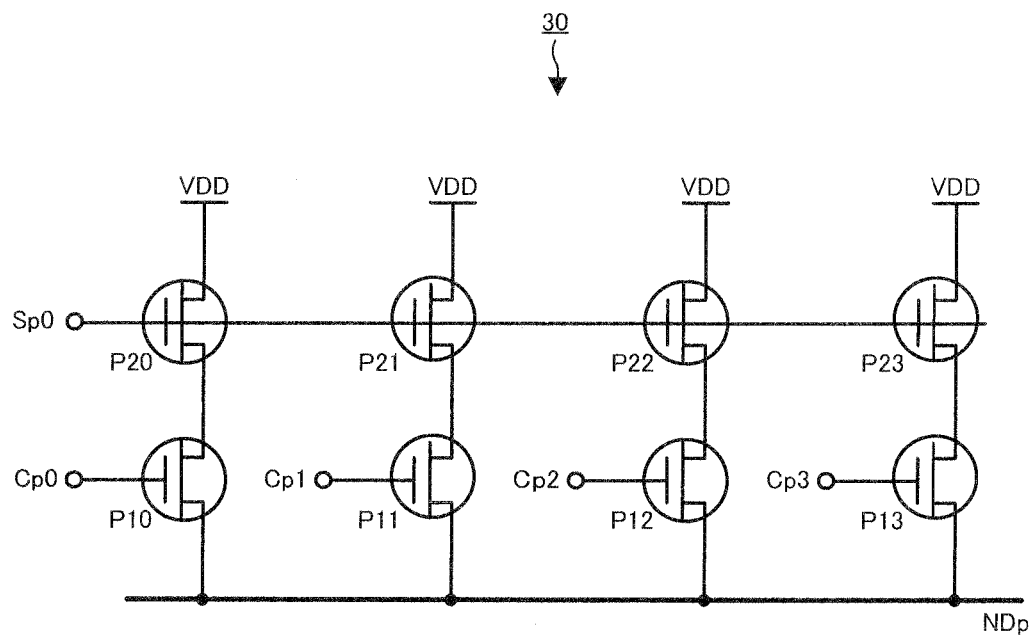
FIGS. 2A and 2B are diagrams showing a specific circuit configuration of the output circuit unit 15 of FIG. 1.
Figure 2B:
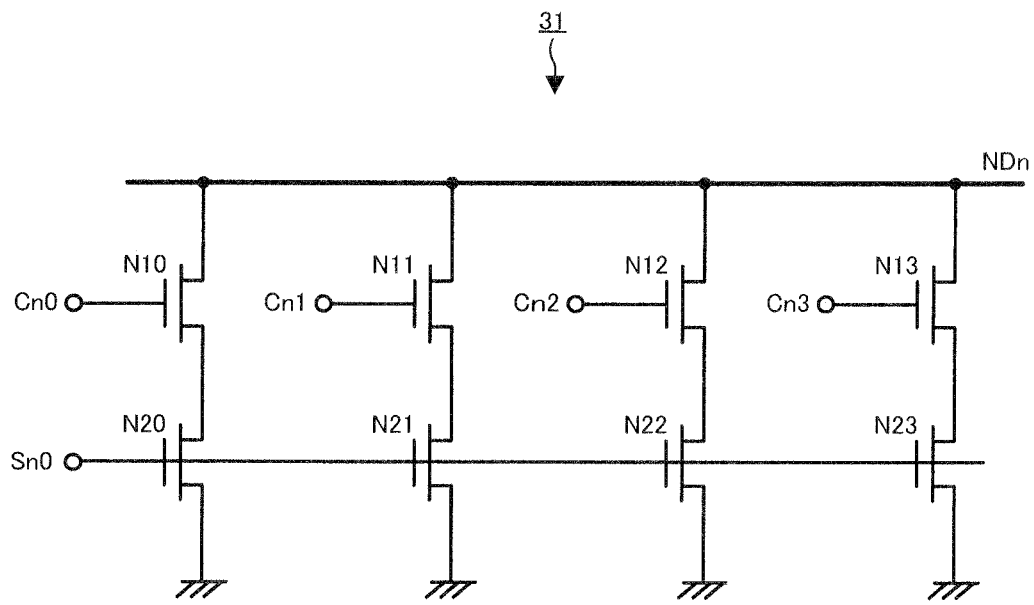

First, a specific circuit configuration of the output circuit unit 15 of FIG. 1 will be described with reference to FIGS. 2A and 2B. FIG. 2A shows a circuit configuration of the first output circuit 30 and FIG. 2B shows a circuit configuration of the second output circuit 31. The first output circuit 30 of FIG.

2A is composed of eight PMOS transistors P10, P11, P12, P13, P20, P21, P22 and P23. A first series circuit composed of PMOS transistors P20 and P10, a second series circuit composed of PMOS transistors P21 and P11, a third series circuit composed of PMOS transistors P22 and P12, and a fourth series circuit composed of PMOS transistors P23 and P13 are respectively connected in parallel between a supply voltage VDD and the output node NDp.

An output control signal Sp0 is commonly applied to the respective gates of the PMOS transistors P20 to P23 of the first to fourth series circuits. When the output control signal Sp0 is controlled to be low, the PMOS transistors P20 to P23 turn on and the voltage of the output node NDp rises. When the output control signal Sp0 is controlled to be high, the PMOS transistors P20 to P23 turn off and the voltage of the output node NDp drops. Meanwhile, the least significant adjustment code Cp0, the second adjustment code Cp1, the third adjustment code Cp2 and the most significant adjustment code Cp3 are respectively applied, in this order, to the gates of the PMOS transistors P10 to P13 of the first to fourth series circuits. In this case, the on/off states of the four PMOS transistors P10 to P13 can be freely switched according to the pattern of the adjustment codes Cp0 to Cp3.

In FIG. 2A, the four PMOS transistors P10 to P13 differ in size from one another. Assuming that the PMOS transistor P10 has a unit size (gate width), then the size of the PMOS transistor P11 is set twice as large, the size of the PMOS transistor P12 is set four times as large, and the size of the PMOS transistor P13 is set eight times as large. Accordingly, when all of the first to fourth series circuits are taken into consideration, combinations of 15 steps are assumed up to a size of 16 times at which all of the four PMOS transistors P10 to P13 are on, relative to the unit size at which only the PMOS transistor P10 is on. If in this case, the four PMOS transistors P10 to P13 are controlled in a range from Cp=0001 to Cp=1111, where the adjustment code Cp is represented by a binary number, correspondingly the total size of the PMOS transistors P10 to P13 selectively changes. Note that when including an adjustment code Cp=0000, it is possible to add a case where all of the PMOS transistors P10 to P13 are off.

The second output circuit 31 of FIG. 2B is composed of eight NMOS transistors N10, N11, N12, N13, N20, N21, N22 and N23. A first series circuit composed of NMOS transistors N10 and N20, a second series circuit composed of NMOS transistors N11 and N21, a third series circuit composed of NMOS transistors N12 and N22, and a fourth series circuit composed of NMOS transistors N13 and N23 are respectively connected in parallel between the output node NDn and ground.

An output control signal Sn0 is commonly applied to the respective gates of the NMOS transistors N20 to N23 of the first to fourth series circuits. When the output control signal Sp0 is controlled to be high, the NMOS transistors N20 to N23 turn on and the voltage of the output node NDn drops. When the output control signal Sn0 is controlled to be low, the NMOS transistors N20 to N23 turn off and the voltage of the output node NDn rises. Meanwhile, the least significant adjustment code Cn0, the second adjustment code Cn1, the third adjustment code Cn2 and the most significant adjustment code Cn3 are respectively applied, in this order, to the gates of the NMOS transistors N10 to N3 of the first to fourth series circuits. In this case, the on/off states of the four NMOS transistors N10 to N13 can be freely switched according to the pattern of the adjustment codes Cn0 to Cn3.

In FIG. 2B, sizes (gate widths) of the four NMOS transistors N10 to N13 are set, in this order, one time (unit size), two times, four times, and eight times as large as the unit size, as in the case of FIG. 2A. Also in this case, combinations of 15 steps are assumed corresponding to the on/off-states of the four NMOS transistors N10 to N13, which is in a range from Cn=0001 to Cn=1111, as explained using FIG. 2A. If in this case, the four NMOS transistors N10 to N13 are controlled in a range from Cp=0001 to Cp=1111, where the adjustment code Cn is represented by a binary number, correspondingly the total size of the NMOS transistors N10 to N13 selectively changes. Note that when including an adjustment code Cp=0000, it is possible to add a case where all of the NMOS transistors N10 to N13 are off.

In the first output circuit 30 and the second output circuit 31 described above, the output impedance varies in proportion to the above sizes of 15 steps. Consequently, adjustments can be made so as to obtain optimum output impedances from the combinations of 15 steps on the P-channel and N-channel sides, respectively, by varying the adjustment codes Cp and Cn by means of control described later. When the number of bits of the adjustment codes Cp and Cn are increased, it is possible to control the output impedance in finer steps. Since currents flowing though the first output circuit 30 and the second output circuit 31 vary in inverse proportion to the respective output impedances, it is possible to obtain desired output amplitudes at the output nodes NDp and NDn, respectively, according to appropriately controlled current values.

Figure 3:
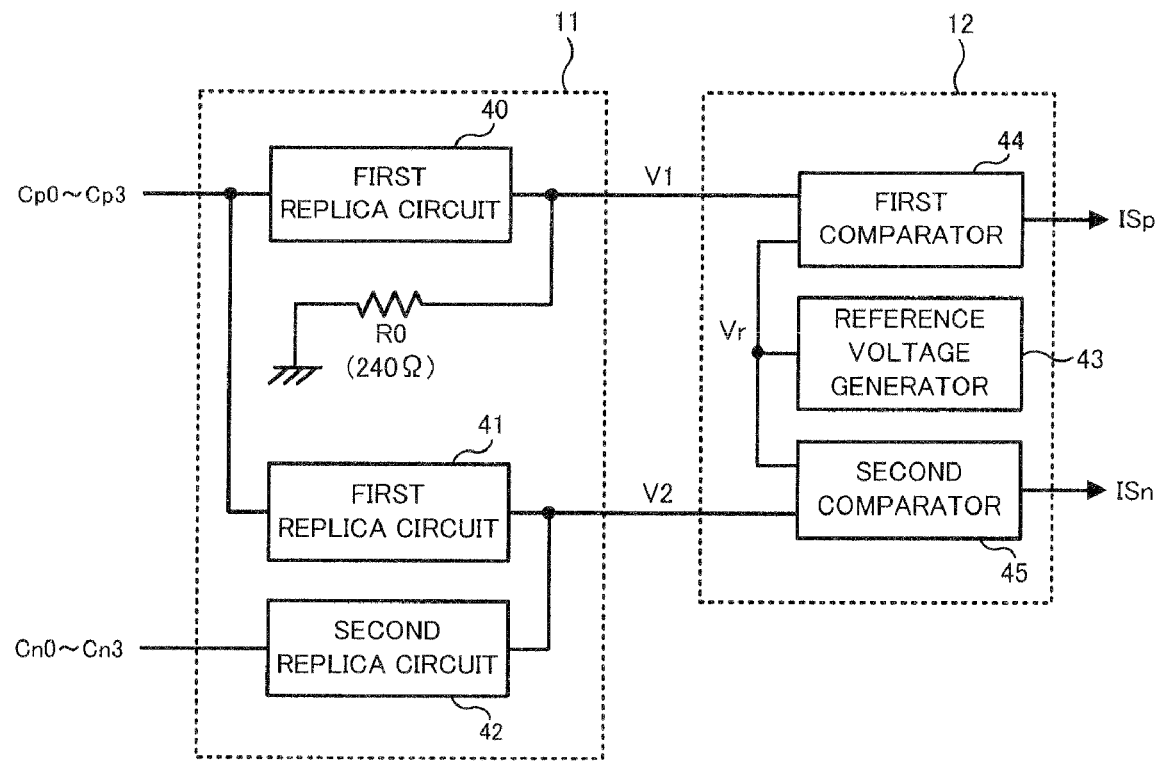
FIG. 3 is a diagram showing configurations of a replica circuit unit 11 and a comparator unit 12 of FIG. 1.

Next, configurations of the replica circuit unit 11 and the comparator unit 12 of FIG. 1 will be described with reference to FIG. 3. In FIG. 3, the replica circuit unit 11 including first replica circuits 40 and 41, a second replica circuit 42 and a reference resistor RO is shown, and also the comparator unit 12 including a reference voltage generator 43, a first comparator 44 and a second comparator 45 is shown. In the replica circuit unit 11, the two first replica circuits 40 and 41 have the same circuit configuration as that of the first output circuit 30 of the output circuit unit 15. Similarly, the second replica circuit 42 has the same circuit configuration as that of the second output circuit 31 of the output circuit unit 15. The above adjustment codes Cp0 to Cp3 are input to the two first replica circuits 40 and 41 and the above adjustment codes Cn0 to Cn3 are input to the second replica circuit 42. Thus, the adjustment codes are applied to the respective gates, in the same manner as in FIGS. 2A and 2B.

The first output circuit 40 and the reference resistor RO are connected in series between a supply voltage VDD (not shown in FIG. 3) and ground, and a control voltage V1 is output from a connection node therebetween. The reference resistor RO is set to, for example, 240Ω. If the output impedance of the first replica circuit 40 is equal to the reference resistor RO, then the control voltage V1 coincides with VDD/2. Further, the first replica circuit 41 and the second replica circuit 42 are connected in series between the supply voltage VDD and the ground, and a control voltage V2 is output from a connection node therebetween. If the output impedances of the first replica circuit 41 and the second replica circuit 42 are equal to each other, then the control voltage V2 coincides with VDD/2.

In the comparator unit 12, the P-channel side control voltage V1 is input to one input terminal of the first comparator 44 and the N-channel side control voltage V2 is input to one input terminal of the second comparator 45. A reference voltage Vr output from the reference voltage generator 43 is input to the other input terminals of these first and second comparators 44 and 45. The first comparator 44 outputs the result of comparing magnitudes of the control voltage V1 and the reference voltage Vr as a binary internal counter control signal ISp. Further, the second comparator 45 outputs the result of comparing magnitudes of the control voltage V2 and the reference voltage Vr as a binary internal counter control signal ISn.

Here, the reference voltage Vr is set to, for example, VDD/2. In this case, the internal counter control signal ISp of high or low is output according to the magnitude relation between the control voltage V1 and VDD/2 in the first comparator 44. Similarly, the internal counter control signal ISn of high or low is output according to the magnitude relation between the control voltage V2 and VDD/2 in the second comparator 45. The correlation between the comparison results in the first and second comparators 44 and 45 and high/low states of the respective internal counter control signals ISp and ISn is prescribed in association with the later described count operation of the counter control unit 13.

Figure 4:
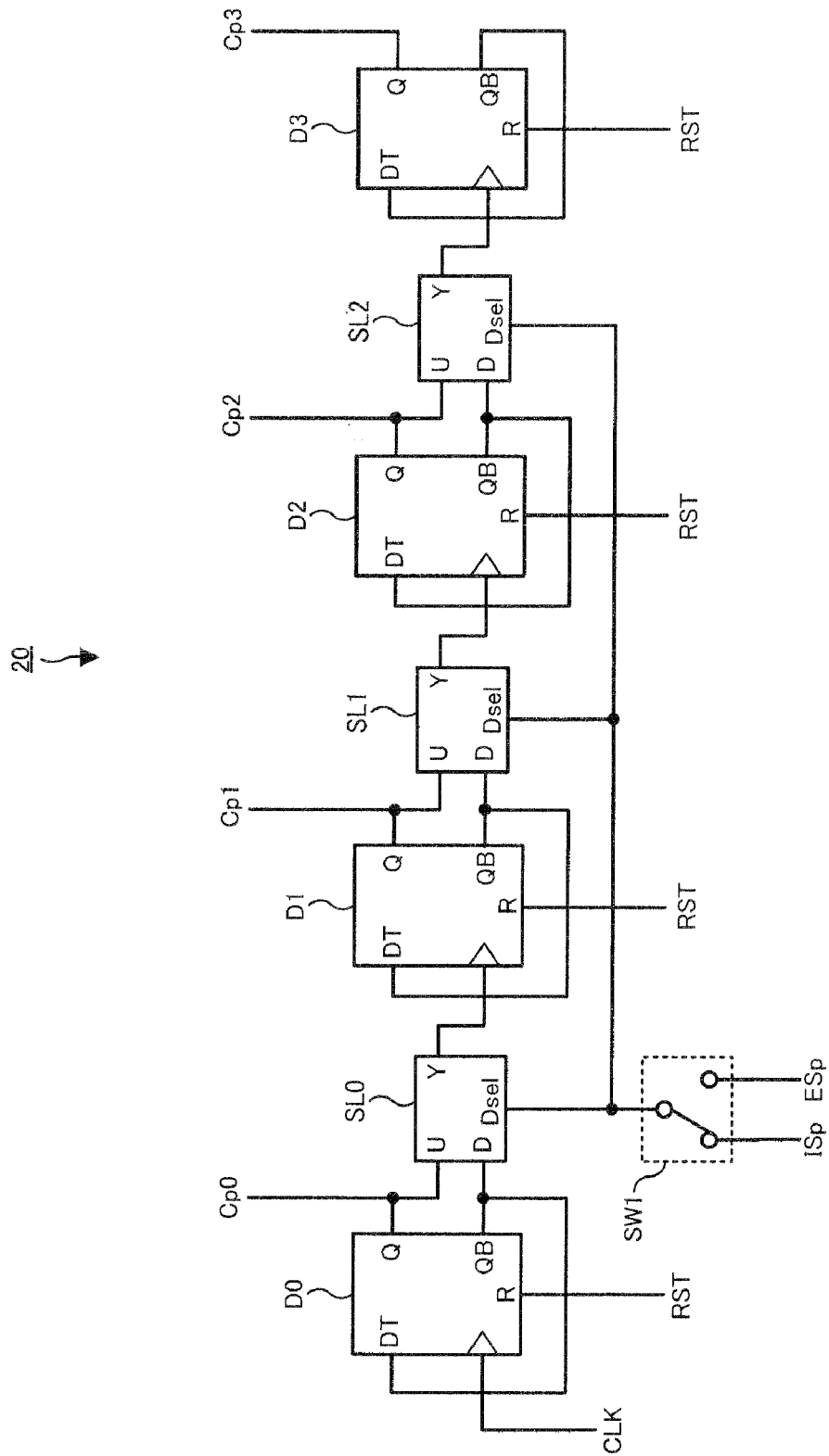
FIG. 4 is a diagram showing a configuration of a first counter 20 in a counter control unit 13 of FIG. 1.

Next, a configuration of the first counter 20 in the counter control unit 13 of FIG. 1 will be described with reference to FIG. 4. Here, the second counter 21 differs only in signal names from the first counter 20 and has the same configuration as that of the first counter 20, so description thereof is omitted. As shown in FIG. 4, the first counter 20 is a 4-bit up/down counter including four-stage D flip-flops D0, D1, D2 and D3, three selectors SL0, SL1 and SL2 each interposed between adjacent D flip-flops, and a switch SW1. This up/down counter performs a count-up operation or a count-down operation in synchronization with a clock CLK.

The four D flip-flops D0 to D3 output signals from respective output terminals Q as the adjustment codes Cp0 to Cp3 in this order, and the signals from respective inverting output terminals QB are fed back to data terminals DT on the input side of the D flip-flops D0 to D3. Further, the respective output terminals Q of three D flip-flops D0 to D2 are connected to UP-side terminals U of subsequent selectors SL0 to SL2, and respective inverting output terminals QB are connected to DOWN-side terminals D thereof. Furthermore, a reset signal RST is input to respective reset terminals R of the four D flip-flops D0 to D3.

The clock CLK having a predetermined frequency is input to a clock terminal of the first-stage D flip-flop D0. Further, respective output terminals Y of the selectors SL0 to SL2 are connected to the clock terminals of the subsequent D flip-flops D1 to D3. The switch SW1 selectively switches between the internal counter control signal ISp connected to the input side thereof and the external counter control signal ESp, and the output of the switch SW1 is connected to respective DOWN select terminals Dsel of the selectors SL0 to SL2. This switch SW1 functions as a switching controller of the present invention in combination with the counter control unit 13.

By such a configuration, when the respective DOWN select terminals Dsel of the selectors SL0 to SL2 are controlled to be low, paths through the respective UP-side terminals U are enabled and the four-stage D flip-flops D0 to D3 operate as a 4-bit up counter. In contrast, when the respective DOWN select terminals Dsel of the selectors SL0 to SL2 are controlled to be high, paths through the respective DOWN-side terminals D are enabled and the four-stage D flip-flops D0 to D3 operate as a 4-bit down counter. In both cases, the four-bit adjustment codes Cp0 to Cp3 are obtained based on count values of the up counter and the down counter.

On the other hand, the D flip-flops D0 to D3 are reset when the reset terminals R are controlled to be low and are set when the reset terminals R are controlled to be high. In this case, the common reset signal RST may be supplied to the four D flip-flops D0 to D3 to reset (0000) or set (1111) them all together. Alternatively, the respective reset signals RST may be separately controlled to give an arbitrary initial value to the flip-flops.

In the count operation of the first counter 20 and the second counter 21, it is possible to control the operating state and the stopped state according to a stop signal (not shown) supplied from the counter control unit 13.

Figure 5:
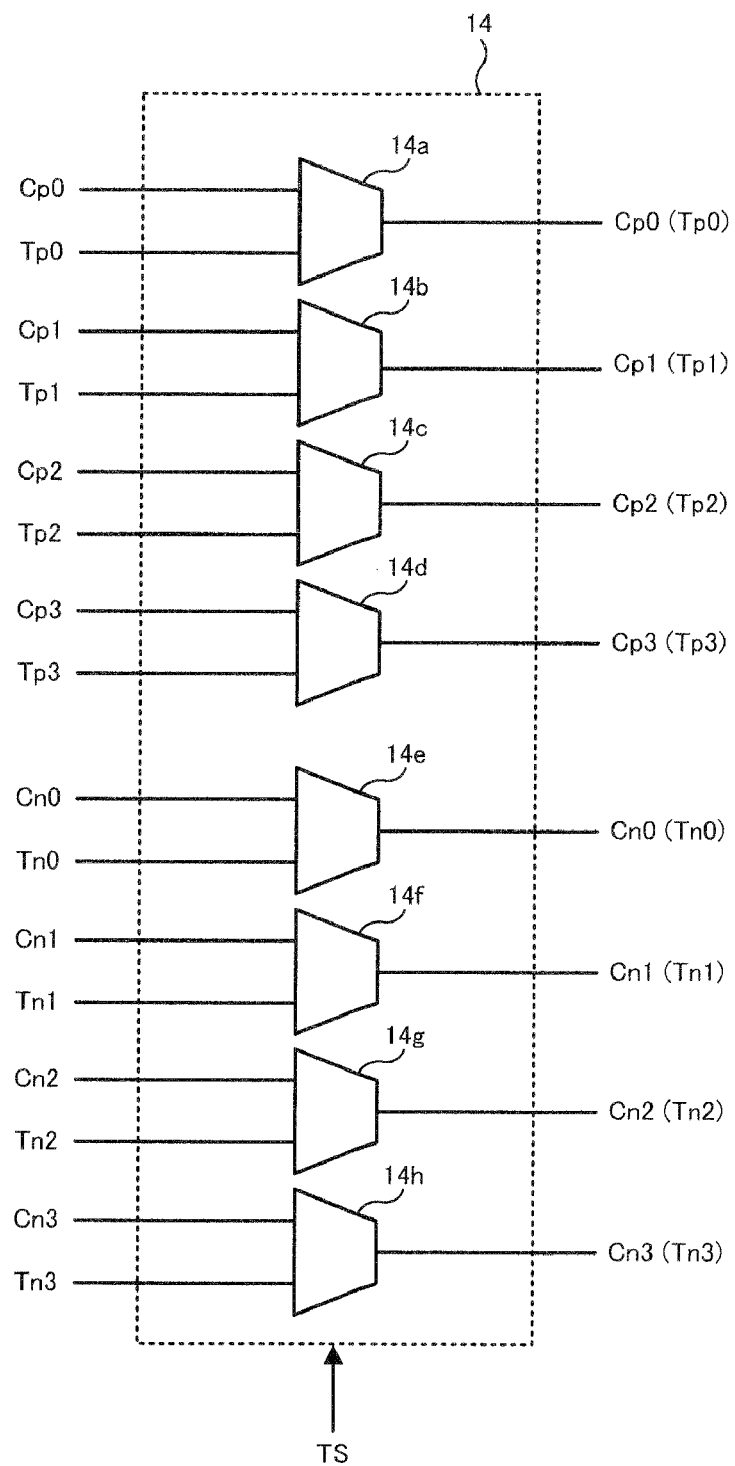
FIG. 5 is a diagram showing a configuration of a selector unit 14 of FIG. 1.

Next, a configuration of the selector unit 14 of FIG. 1 will be described with reference to FIG. 5. As shown in FIG. 5, the selector unit 14 includes four selectors 14a, 14b, 14c and 14d on the P-channel side and four selectors 14e, 14f, 14g and 14h on the N-channel side. Adjustment codes Cp0, Cp1, Cp2 and Cp3 from the counter control unit 13 are input to one ends of the selectors 14a, 14b, 14c and 14d on the P-channel side, in this order, and test codes Tp0, Tp1, Tp2 and Tp3 from outside are input to the other ends thereof. Similarly, adjustment codes Cn0, Cn1, Cn2 and Cn3 from the counter control unit 13 are input to one ends of the selectors 14e, 14f, 14g and 14h on the N-channel side, in this order, and test codes Tn0, Tn1, Tn2 and Tn3 from outside are input to the other ends thereof. The respective selectors 14a to 14h are capable of selectively switching between the adjustment codes Cp, Cn and the test codes Tp, Tn, according to a test control signal TS. Note that the test control signal TS may be supplied from outside or may be generated in the counter control unit 13.

During normal operation, control is performed so that the selectors 14a to 14h of the selector unit 14 output a total of eight bits of adjustment codes Cp and Cn. On the other hand, during the test of the semiconductor device, there are a case where the selectors 14a to 14h of the selector unit 14 output a total of eight bits of adjustment codes Cp and Cn, and a case where the selectors 14a to 14h output a total of eight bits of test codes Tp and Tn. When performing a test in accordance with a conventional method, there is a need to switch to the side of the test codes Tp and Tn. However, the test of the embodiment has a feature of switching to the side of the adjustment codes Cp and Cn. A specific test sequence of the embodiment will be described later.

Figure 6:
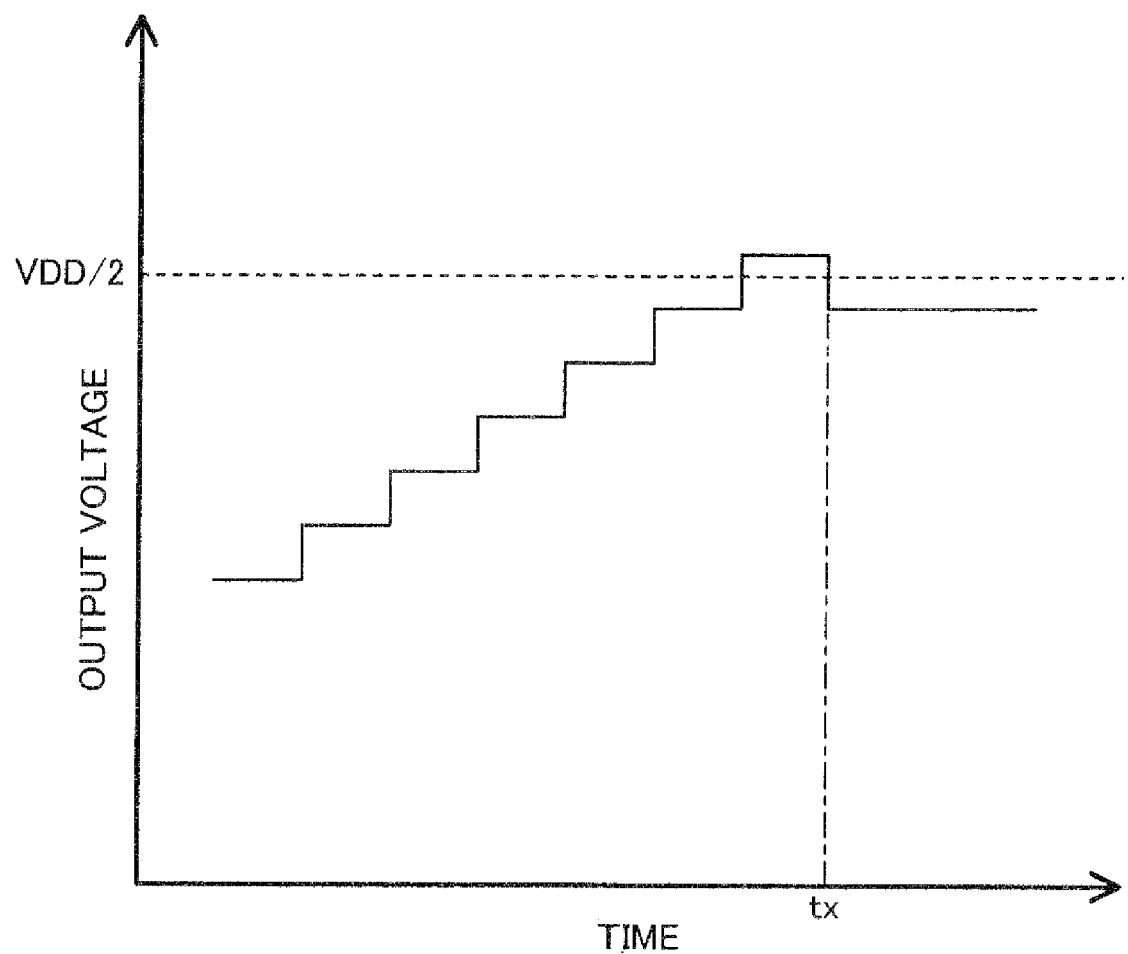
FIG. 6 is a diagram explaining an initial automatic adjustment function in the output impedance adjustment circuit of the embodiment.

Next, operation of the output impedance adjustment circuit of the embodiment will be described. An initial automatic adjustment function will be described with reference to FIG. 6, which is performed before an unadjusted output impedance is appropriately adjusted during normal operation of the output impedance adjustment circuit. Note that the output impedance automatic adjustment function is performed separately for the P-channel and N-channel sides. In FIG. 6, an example is shown in which the adjustment starts from a lower output voltage relative to VDD/2 as a target output voltage of the output circuit unit 15. The above mentioned automatic adjustment function can be applied to both the N-channel and P-channel sides, however the following explanation will be made by exemplifying the P-channel side.

Assuming that the output impedance increases and the output voltage decreases due to an increase in the adjustment code Cp of the P-channel side, then the adjustment code Cp is too large relative to the target value at the starting point in FIG. 6. That is, the output impedance is large and the output voltage is low in the output circuit 30 of FIG. 2A. Therefore, the count-down operation is performed by the operation of the replica circuit unit 11, the comparator unit 12 and the counter control unit 13 in the output impedance adjustment circuit, so that the adjustment code Cp is controlled to be decreased. The output voltage rises stepwise, as shown in FIG. 6, corresponding to the decrease in the adjustment code Cp by one step at each time.

At the moment when the adjustment code Cp has decreased by six steps in total, the output voltage exceeds VDD/2.

Thereby, the comparison result of the first comparator 44 is inverted and the first counter 20 is switched from the count-down operation to the count-up operation. Thus, the adjustment code Cp increases by one step in a subsequent operation, and the output voltage decreases (time tx). Since the output voltage is extremely close to the target VDD/2 at this point, it is possible to determine that the output impedance has been adjusted to a value close to the reference resistor RO. The counter control unit 13 temporarily stops subsequent count operations and the stop signal for keeping this state for a predetermined period of time is supplied. It is preferable that the automatic adjustment function shown in FIG. 6 is performed periodically during normal operation, as well as at the time of power-on and resetting.

Figure 7:
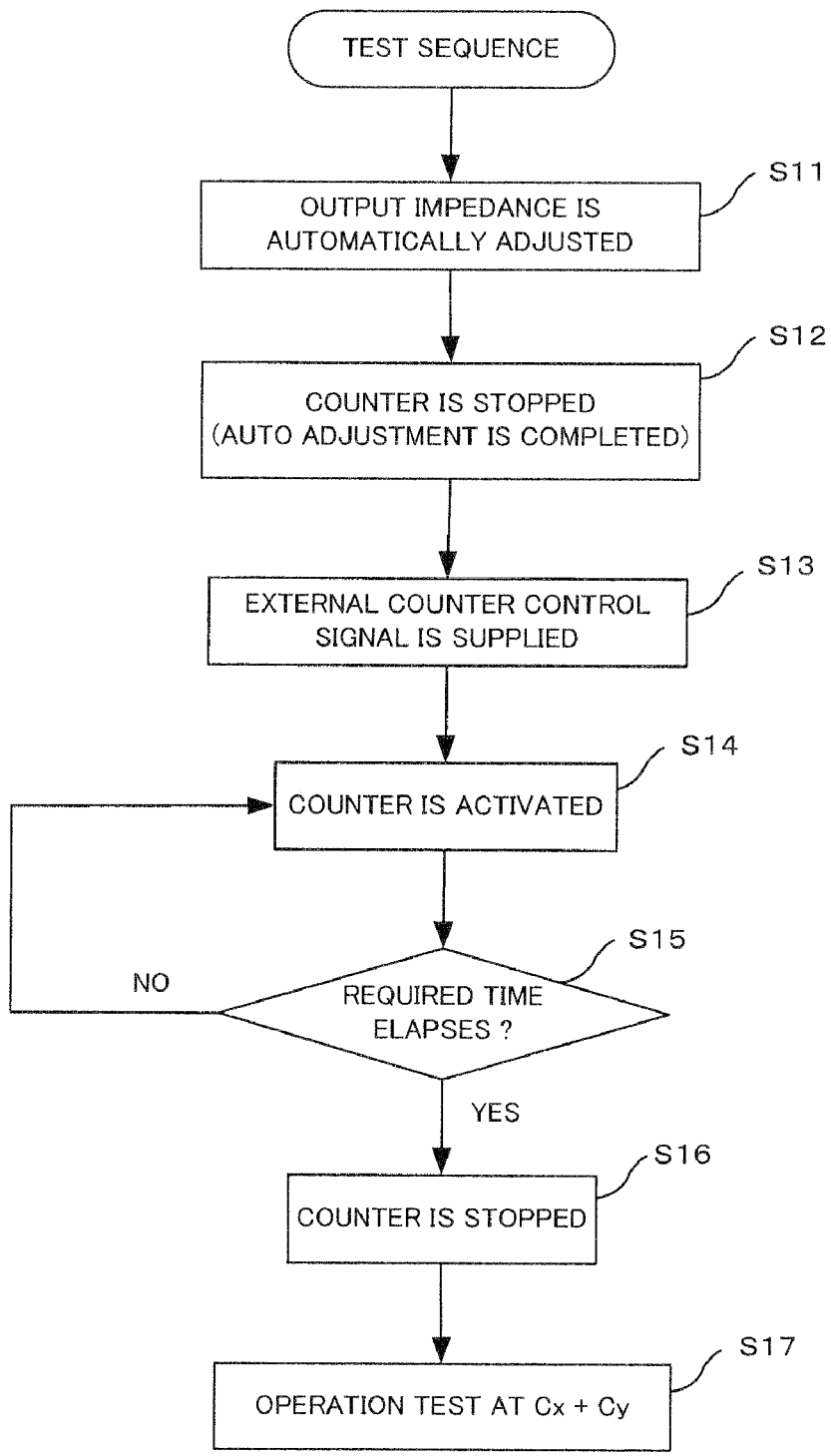
FIG. 7 is a flowchart showing an example of a test sequence performed using the output impedance adjustment circuit of the embodiment.

Next, a control in the test of the output impedance adjustment circuit of the embodiment will be described. FIG. 7 is a flowchart showing an example of a test sequence performed using the output impedance adjustment circuit. This test sequence can be applied for both the P-channel and N-channel sides. When the control shown in FIG. 7 is started, the above automatic adjustment of the output impedance is performed first (step S11). Then, when the output impedance reaches an approximate value of the reference resistor RO, as shown in FIG. 6, the automatic adjustment is completed as described above and the first counter 20 or the second counter 21 is stopped by the stop signal (step S12).

Assuming the value of the adjustment code Cp or Cn at this point is Cx, although the value of Cx itself cannot be externally determined, it is possible to set a relative value for which Cx is used as a starting point to a target value. Hereinafter, a case will be considered in which the adjustment code Cx is controlled and increased to Cx+Cy. First, the external counter control signal ESp or ESn is controlled to be low in the counter control unit 13 and is supplied to the respective DOWN select terminals Dsel of the selectors SL0 to SL2 by switching the switch SW1 of FIG. 4 (step S13). The stop signal is cancelled in this state and the first counter 20 or the second counter 21 is activated (step S14).

The adjustment code Cp or Cn is increased by one at each period of the clock CLK by the count-up operation. In this case, it is possible to previously determine the required time to reach Cx+Cy based on the period of the clock CLK. Thus, the count-up operation continues until the above required time elapses (step S15: NO), and at the time when the required time elapses (step S15: YES) the first counter 20 or the second counter 21 is once again stopped by the stop signal (step S16). Since the adjustment code Cp or Cn is locked to Cx+Cy at this point, a desired operation test is performed in this state (step S17).

The flowchart shown in FIG. 7 can be applied, in the same manner as described above, to a case where the adjustment code Cx is controlled and decreased to Cx−Cy. In this case, the external counter control signal ESp or ESn is controlled to be high and the adjustment code Cp or Cn is finally locked to Cx−Cy by the count-down operation. Accordingly, it is possible to set both Cx+Cy which is an upper limit and Cx−Cy which is a lower limit, as a test range, thereby performing the desired operation test. In addition, the flowchart shown in FIG. 7 can be applied in the same manner to both the P-channel and N-channel sides. Thus, by sequentially controlling four targets including the upper and lower limits of both sides, it is possible to perform a basic operation test for the output circuit unit 15 of the semiconductor device.

As described above, the output impedance adjustment circuit of the embodiment is configured so that there is no need for a tester to previously consider the adjustment codes Cp and Cn used in the test and the tester can set a test condition by setting only relative values for the adjustment codes Cp and Cn using the automatic adjustment function for the output impedance. Therefore, even when the relationship between the output impedance and the adjustment code varies due to fluctuation in process, temperature or supply voltage, and cannot be previously known, an optimum operation test can be performed without setting an inappropriate test range.

Figure 8:
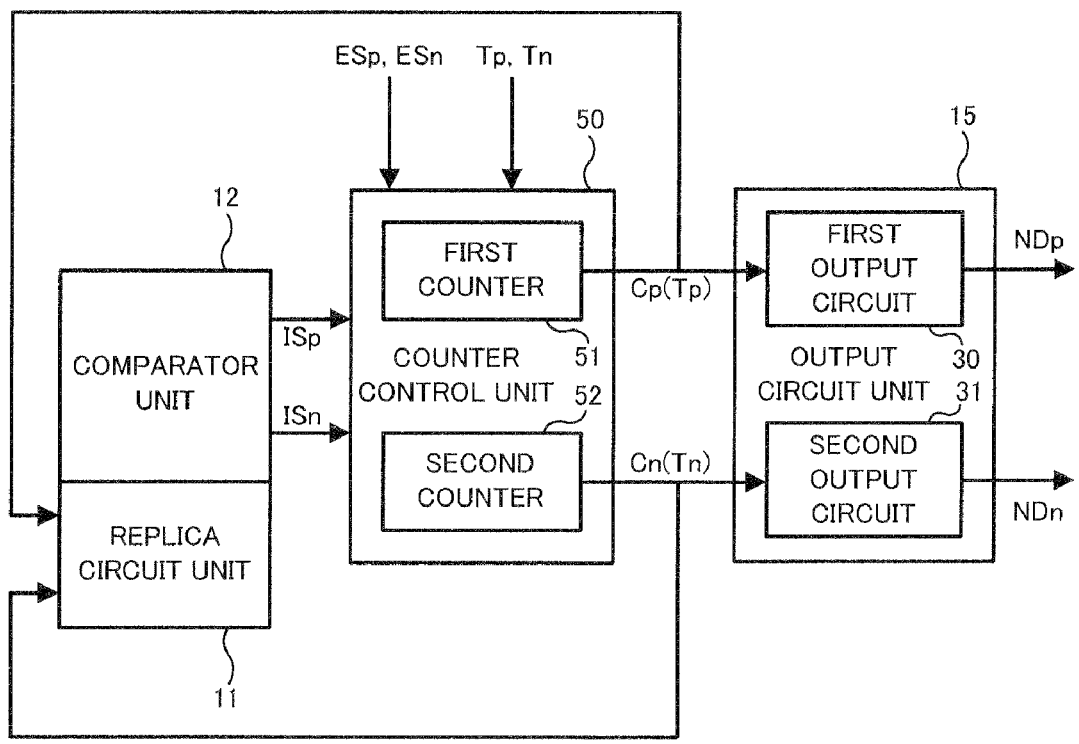
FIG. 8 is a block diagram showing an overall configuration of an output impedance adjustment circuit of a modification of the embodiment.

The output impedance adjustment circuit of the embodiment is not limited to the above configuration and can be modified in various ways. A modification of the embodiment will be described with reference to FIGS. 8 and 9. FIG. 8 is a block diagram showing an overall configuration of an output impedance adjustment circuit of the modification. In FIG. 8, configuration and operation of the replica circuit unit 11, the comparator unit 12 and the output circuit unit 15 are the same as those shown in FIG. 1. On the other hand, in the modification, configuration and operation of a counter control unit 50 including a first counter 51 and a second counter 52 are different from those shown in FIG. 1, and the modification has a configuration such that test codes Tp and Tn from outside are supplied to the counter control unit 50, without being provided with the selector unit 14 of FIG. 1.

Figure 9:
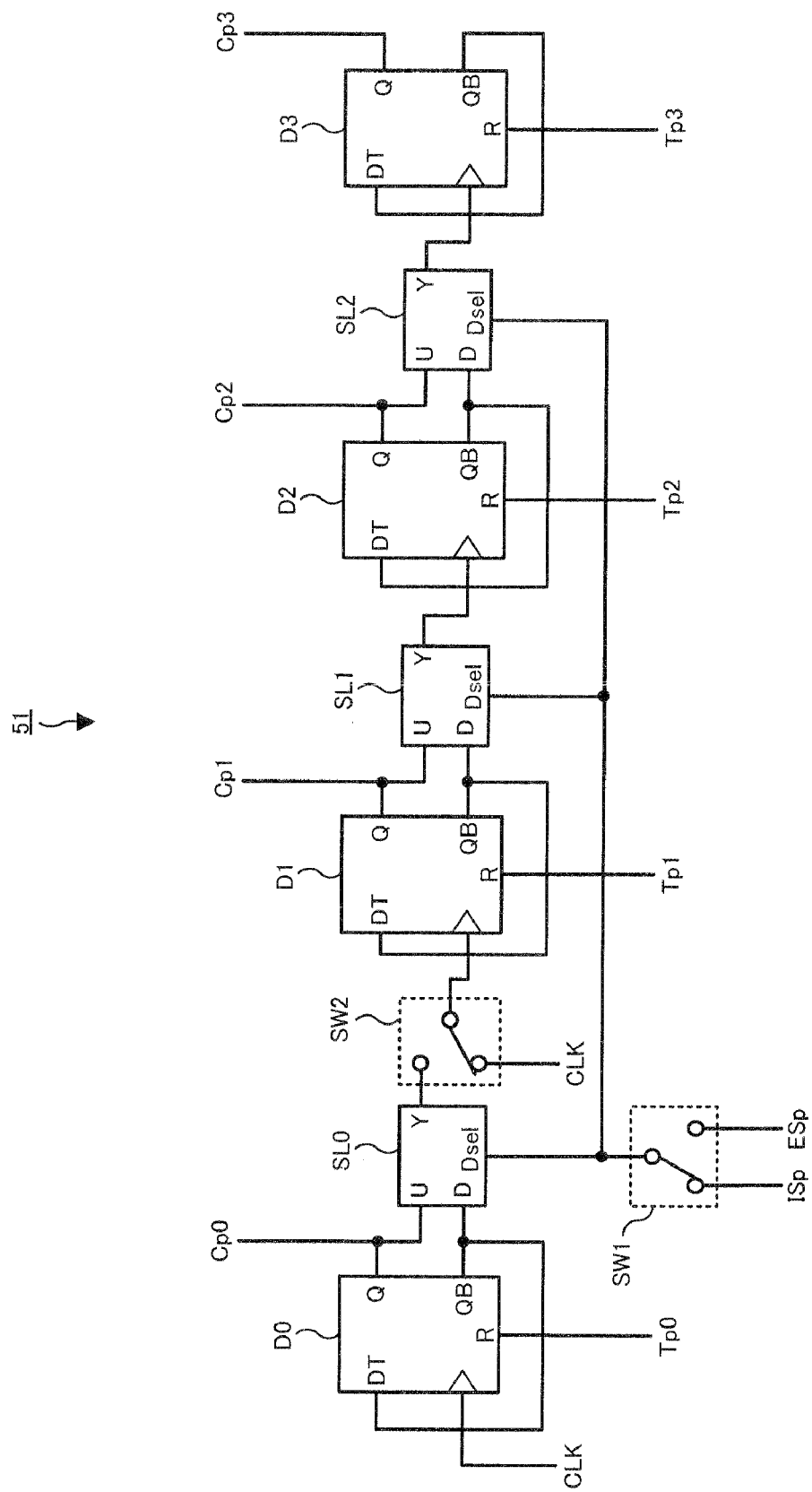
FIG. 9 is a diagram showing a configuration of a first counter 51 of a counter control unit 50 of FIG. 8.
Figure 10:
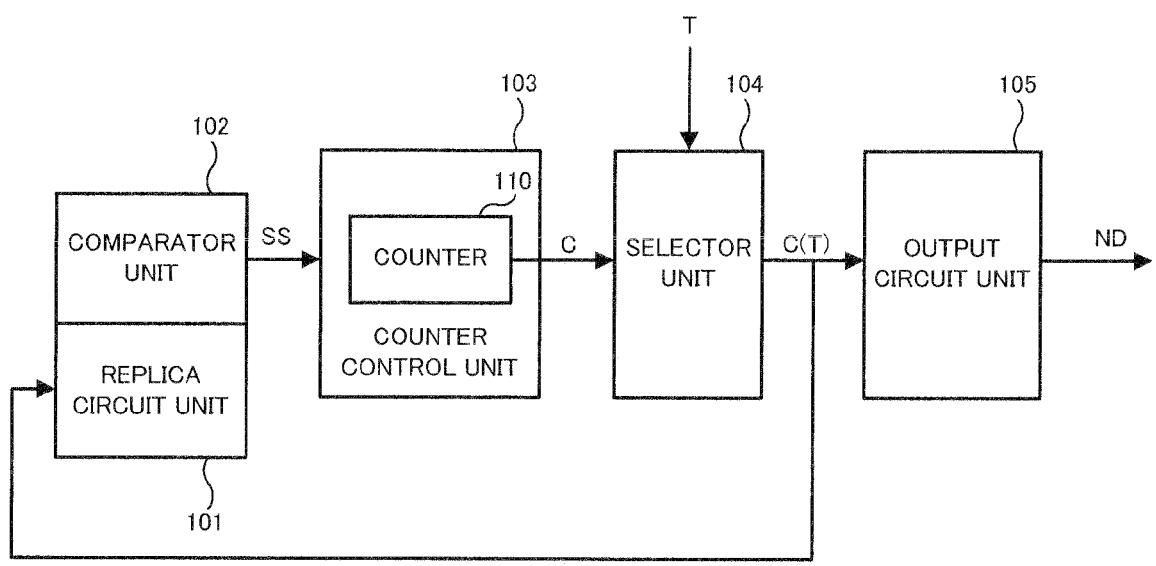
FIG. 10 is a block diagram showing an overall configuration of a conventional output impedance adjustment circuit.
Figure 11:
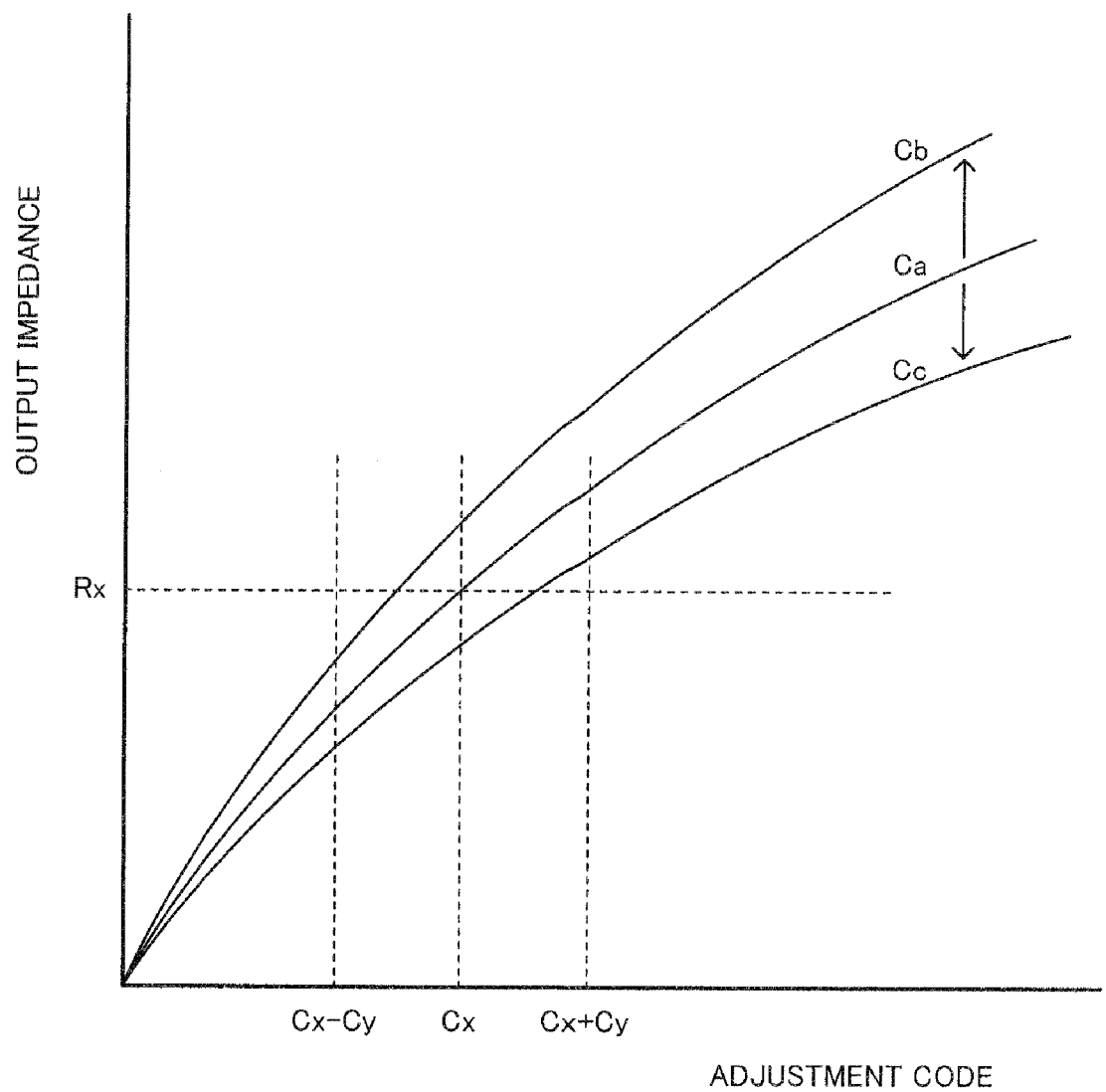
FIG. 11 is a diagram showing an example of a relationship between an output impedance and an adjustment code.

FIG. 9 shows a configuration of the first counter 51 of the counter control unit 50 in FIG. 8. Note that the second counter 52 only differs in signal names from the first counter 51 and has the same configuration as the first counter 51, so description thereof is omitted. As shown in FIG. 9, D flip-flops D0, D1, D2 and D3, selectors SL0, SL1 and SL2, and a switch SW1 in the first counter 51 are the same as the configuration of FIG. 4. Meanwhile, a switch SW2 is provided between the selector SL0 of the first stage and the D flip-flop D1 of the second stage. This switch SW2 switches between an output terminal Y of the selector SL0 and the clock CLK, either of which is selectively connected to the clock terminal of the D flip-flop D1.

When the switch SW2 is switched to the output terminal Y of the selector SL0, the connection is the same as in FIG. 4. Thus, the count-up or count-down operation is performed in synchronization with the clock CLK input to the clock terminal of the D flip-flop D0 of the first stage. On the other hand, when the switch SW2 is switched to the clock CLK, the D flip-flop D0 of the first stage and the D flip-flop D1 of the second stage are disconnected, so that the first counter 51 operates as a 3-bit up/down counter. In this case, the clock CLK is input to the clock terminal of the D flip-flop D1 through the switch SW2, and the three bits of adjustment codes Cp1, Cp2 and Cp3 change in synchronization with the clock CLK. Note that the least significant adjustment code Cp0 is in a "DON'T CARE" state. Consequently, the update rate of the four-bit adjustment code Cp is twice that of FIG. 4 relative to the clock CLK of the same frequency since the 4-bit adjustment code Cp is updated by two steps along with the count operation.

In FIG. 9, test codes Tp0, Tp1, Tp2 and Tp3 are input to the respective reset terminals R of the D flip-flops D0 to D3 in this order. Thereby, it is possible to give a pattern of the test code Tp to the D flip-flops D0 to D3 as an initial value when performing a test using the test code Tp without using the adjustment code Cp. At this point, if the count operation is in a state of being stepped by the first counter 51, it is possible to continuously output the adjustment code Cp identical to the test code Tp. Thereby, the selector unit 14 of FIG. 1 is no longer necessary, and therefore the entire circuit scale can be reduced.

Although in the modification, a configuration in which the switch SW2 is provided between the first-stage selector SL0 and the second-stage D flip-flop D1 is shown in FIG. 9, the position of the switch SW2 may be changed. If the switch SW2 is provided between the second-stage selector SL1 and the third-stage D flip-flop D2, for example, then the adjustment code Cp is updated by four steps at each time, and the update rate quadruples relative to the configuration of FIG. 4. Further, if the switch SW2 is provided between the third-stage selector SL2 and the fourth-stage D flip-flop D3, then the adjustment code Cp is updated by eight steps at each time, and the update rate octuples relative to the configuration of FIG. 4. In particular, if the adjustment codes Cp and Cn have a large number of bits and the adjustment codes Cp and Cn for which the automatic adjustment has completed are changed by a relatively large number of steps in the test sequence, it is useful to adopt the modification from the viewpoint of shortening a test time.

In the embodiment described above, the test sequence explained using FIG. 7 may be controlled by storing commands in a register attached to the output impedance adjustment circuit, in addition to providing commands from outside. In this case, when the tester simply instructs the start of the test, the test sequence can be automatically performed based on commands read from the register in a subsequent control.

Further, in the embodiment, when it is not necessary to perform the test in accordance with the conventional method, a configuration can be employed in which only the adjustment codes Cp and Cn are supplied to the output circuit unit 15 and the replica circuit unit 11 without providing the selector unit 14 in the configuration of FIG. 1. In this case, since the test codes Tp and Tn are not used, it is premised that the automatic adjustment function is always utilized in the test, as the test sequence of FIG. 7.

Furthermore, in the embodiment, it is possible to appropriately alter the direction of changes in the output impedance and the adjustment codes Cp and Cn. For example, an increasing or decreasing direction in the adjustment codes Cp and Cn can be reversed relative to an increase or decrease in the output impedance, by inverting the polarity of the first and second comparators 44 and 45 or by inverting the internal counter control signals ISp and ISn input to the first and second counters 20 and 21 using inverters.

The present invention is not limited to the above described embodiments, and various variations and modifications may be possible without departing from the scope of the present invention.

This application is based on the Japanese Patent application No. 2007-113575 filed on Apr. 23, 2007, entire content of which is expressly incorporated by reference herein.

What is claimed is:

1. A semiconductor device having an output impedance adjustment circuit for automatically adjusting an output impedance of an output circuit including a plurality of transistors connected in parallel,
   wherein said output impedance adjustment circuit comprises:
   a replica circuit including a circuit portion of a substantially same configuration as said output circuit;
   a comparator for comparing a magnitude of the output impedance of said replica circuit with that of a reference resistor and for outputting a comparison result as an internal counter control signal;
   a switching controller capable of selectively switching between an external counter control signal supplied from outside and the internal counter control signal output from said comparator;
   a counter circuit for performing a count-up or count-down operation selectively according to the internal counter control signal or the external counter control signal and for outputting a count value of a predetermined number of bits as an adjustment code; and
   a selector unit for selectively outputting a test code supplied from outside and the adjustment code output from said counter circuit and for supplying the code to said output circuit and said replica circuit,
   wherein the adjustment code is supplied to said output circuit and said replica circuit, and each of said plurality of transistors is controlled to be on/off based on the adjustment code.

2. The semiconductor device according to claim 1, wherein said output circuit includes a first output circuit including a plurality of PMOS transistors and a second output circuit including a plurality of NMOS transistors,
   and said replica circuit, said comparator, said switching controller and said counter circuit are provided separately for said first and second output circuits.

3. A semiconductor device having an output impedance adjustment circuit for automatically adjusting an output impedance of an output circuit including a plurality of transistors connected in parallel,
   wherein said output impedance adjustment circuit comprises:
   a replica circuit including a circuit portion of a substantially same configuration as said output circuit;
   a comparator for comparing a magnitude of the output impedance of said replica circuit with that of a reference resistor and for outputting a comparison result as an internal counter control signal;
   a switching controller capable of selectively switching between an external counter control signal supplied from outside and the internal counter control signal output from said comparator; and
   a counter circuit for performing a count-up or count-down operation selectively according to the internal counter control signal or the external counter control signal and for outputting a count value of a predetermined number of bits as an adjustment code,
   and the adjustment code is supplied to said output circuit and said replica circuit, and each of said plurality of transistors is controlled to be on/off based on the adjustment code,
   wherein said output circuit includes a first output circuit including a plurality of PMOS transistors and a second output circuit including a plurality of NMOS transistors,
   and said replica circuit, said comparator, said switching controller and said counter circuit are provided separately for said first and second output circuits, and
   wherein said replica circuit includes a first replica circuit corresponding to said first output circuit and a second replica circuit corresponding to said second output circuit,
   and said comparator includes a first comparator for comparing a voltage at a connection node of series-connected said first replica circuit and the reference resistor with a predetermined reference voltage and for outputting a first internal counter control signal, and includes a second comparator for comparing a voltage at a connection node of series-connected said first and second replica circuits with the reference voltage and for outputting a second internal counter control signal.

4. The semiconductor device according to claim 3, wherein said switching controller selectively switches between a first external counter control signal and the first internal counter control signal, and selectively switches between a second external counter control signal and the second internal counter control signal, said counter circuit includes a first counter circuit for performing a count-up or count-down operation selectively according to the first external counter control signal or the first internal counter control signal and for outputting a count value of a predetermined number of bits as a first adjustment code, and includes a second counter circuit for performing a count-up or count-down operation selectively according to the second external counter control signal or the second internal counter control signal and for outputting a count value of a predetermined number of bits as a second adjustment code, and the first adjustment code is output to said first output circuit and said first replica circuit so that each of said plurality of PMOS transistors is controlled to be on/off based on the first adjustment code, and the second adjustment code is output to said second output circuit and said second replica circuit so that each of said plurality of NMOS transistors is controlled to be on/off based on the second adjustment code.

5. The semiconductor device according to claim 3, further comprising a selector unit for selectively outputting a test code supplied from outside and the adjustment code output from said counter circuit and for supplying the code to said output circuit and said replica circuit.

6. The semiconductor device according to claim 3, wherein the adjustment code is N (N is an integer equal to or greater than two) bits, each of said output circuit and said replica circuit includes N transistors controlled to be on/off based on bits of the adjustment code, and said N transistors have different sizes from one another.

7. A semiconductor device having an output impedance adjustment circuit for automatically adjusting an output impedance of an output circuit including a plurality of transistors connected in parallel, wherein said output impedance adjustment circuit comprises:

a replica circuit including a circuit portion of a substantially same configuration as said output circuit;

a comparator for comparing a magnitude of the output impedance of said replica circuit with that of a reference resistor and for outputting a comparison result as an internal counter control signal;

a switching controller capable of selectively switching between an external counter control signal supplied from outside and the internal counter control signal output from said comparator; and a counter circuit for performing a count-up or count-down operation selectively according to the internal counter control signal or the external counter control signal and for outputting a count value of a predetermined number of bits as an adjustment code, and the adjustment code is supplied to said output circuit and said replica circuit, and each of said plurality of transistors is controlled to be on/off based on the adjustment code, wherein the adjustment code is N (N is an integer equal to or greater than two) bits, each of said output circuit and said replica circuit includes N transistors controlled to be on/off based on bits of the adjustment code, and said N transistors have different sizes from one another, and wherein, among said N transistors, a transistor controlled based on a least significant bit of the adjustment code has a unit size, and a transistor controlled based on an i-th ($1 \leq i \leq N-1$) bit from the least significant bit of the adjustment code has $2^i$ times the unit size, respectively for the adjustment code of N bits represented in binary code.

8. A semiconductor device having an output impedance adjustment circuit for automatically adjusting an output impedance of an output circuit including a plurality of transistors connected in parallel, wherein said output impedance adjustment circuit comprises:

a replica circuit including a circuit portion of a substantially same configuration as said output circuit;

a comparator for comparing a magnitude of the output impedance of said replica circuit with that of a reference resistor and for outputting a comparison result as an internal counter control signal;

a switching controller capable of selectively switching between an external counter control signal supplied from outside and the internal counter control signal output from said comparator; and a counter circuit for performing a count-up or count-down operation selectively according to the internal counter control signal or the external counter control signal and for outputting a count value of a predetermined number of bits as an adjustment code, and the adjustment code is supplied to said output circuit and said replica circuit, and each of said plurality of transistors is controlled to be on/off based on the adjustment code, wherein the adjustment code is N (N is an integer equal to or greater than two) bits, each of said output circuit and said replica circuit includes N transistors controlled to be on/off based on bits of the adjustment code, and said N transistors have different sizes from one another, and wherein said counter circuit is an N-bit up/down counter for performing a count-up or count-down operation at each period of a clock and for outputting an N-bit count value as the adjustment code.

9. The semiconductor device according to claim 8, wherein a switch circuit for selectively switching a counter output of a previous stage and the clock and for connecting the selected one to a clock terminal of a subsequent stage is provided at a predetermined position of said up/down counter.

10. The semiconductor device according to claim 9, wherein an N-bit test code supplied from outside is input to a reset terminal of each stage of said up/down counter.

11. A test method of an output impedance for testing the output impedance of an output circuit under a predetermined condition for a semiconductor device with an output impedance adjustment circuit that includes, a replica circuit including a circuit portion of a substantially same configuration as the output circuit;

a comparator for comparing a magnitude of the output impedance of the replica circuit with that of a reference resistor and for outputting a comparison result as an internal counter control signal;

a switching controller capable of selectively switching between an external counter control signal supplied from outside and the internal counter control signal output from the comparator; and a counter circuit for performing a count-up or count-down operation selectively according to the internal counter control signal or the external counter control signal and for outputting a count value of a predetermined number of bits as an adjustment code, the method comprising the steps of:

automatically adjusting the output impedance of said output circuit to be tested by operating said replica circuit, said comparator, said switching controller and said counter circuit, in a state in which the internal counter control signal is supplied to said counter circuit by said switching controller;

stopping a count operation of said counter circuit in a state in which the output impedance has automatically adjusted;

restarting the count operation in a state in which the external counter control signal is supplied to said counter circuit by said switching controller;

stopping the count operation of said counter circuit when a required time for updating the adjustment code by a predetermined steps starting from a state of being automatically adjusted with a predetermined number of steps is elapsed; and performing an operation test of the output impedance of said output circuit with the updated adjustment code.

* * * * *